(12) United States Patent
Hsu

(10) Patent No.: US 9,543,724 B2
(45) Date of Patent: Jan. 10, 2017

(54) ELECTRICAL CONNECTOR

(71) Applicant: HON HAI PRECISION INDUSTRY CO., LTD., New Taipei (TW)

(72) Inventor: Shuo-Hsiu Hsu, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 227 days.

(21) Appl. No.: 14/288,196

(22) Filed: May 27, 2014

(65) Prior Publication Data
US 2014/0357109 A1    Dec. 4, 2014

(30) Foreign Application Priority Data

May 30, 2013   (TW) .............................. 102210069 U

(51) Int. Cl.
| | | |
|---|---|---|
| *H05K 7/20* | (2006.01) | |
| *H01R 43/02* | (2006.01) | |
| *H01R 12/70* | (2011.01) | |
| *H01R 12/00* | (2006.01) | |

(52) U.S. Cl.
CPC ........ *H01R 43/0263* (2013.01); *H01R 12/707* (2013.01); *H05K 7/20445* (2013.01)

(58) Field of Classification Search
CPC ................. H05K 2201/1033; H05K 2201/066; H05K 7/20445; H01L 23/40; H01L 2023/4081; H01L 2023/4087; H01L 23/10; H01L 23/4093; H01R 13/629

USPC ........... 361/719, 707, 709; 439/66, 73, 487; 165/104.33; 257/E23.086, E23.083, 717, 257/718, 719
See application file for complete search history.

(56) References Cited

U.S. PATENT DOCUMENTS 6,205,026 B1 * 3/2001 Wong .................. H01L 23/4093
165/80.3

FOREIGN PATENT DOCUMENTS

TW              M285832           1/2006

* cited by examiner

*Primary Examiner* — Binh Tran
(74) *Attorney, Agent, or Firm* — Wei Te Chung; Ming Chieh Chang

(57) ABSTRACT

An electrical connector (100) for positioning a heat sink assembled on the electrical connector and for soldering to a substrate includes an insulating housing (1) with a plurality of electrical contacts (4) received therein and a position member assembled to the insulating housing (1), the position member includes an interlock member (2) and a soldering member (3) assembled together, the interlock member (2) includes an assembling portion (21) and an extending portion (22) extending upwardly from the assembling portion (21) for hooking with the heat sink, the soldering member (3) includes a body portion (31) and a pair of soldering portions (32) extending downwardly from the body portion (31) for soldering to the substrate.

15 Claims, 4 Drawing Sheets

ELECTRICAL CONNECTOR

BACKGROUND OF THE INVENTION

1. Field of the Invention

The present invention relates to an electrical connector, and more particularly to an electrical connector having an improved position member for soldering to a substrate and positioning a heat sink assembled on the electrical connector.

2. Description of Related Art

TW patent No. M285832 issued to Zhu on Jan. 11, 2006 discloses a conventional electrical connector for electrically connecting an IC package with a substrate. The electrical connector includes an insulating housing, a plurality of electrical contacts received in the insulating housing and a plurality of solder balls connected to the electrical contacts. The bottom of the insulating housing defines a post to position the insulating housing on the substrate. Due to there must assemble a heat sink on the electrical connector to dissipate heat, the conventional connector then must set another member to position the heat sink on the electrical connector.

Hence, it is desirable to provide an improved electrical connector to overcome the aforementioned disadvantages.

SUMMARY OF THE INVENTION

Accordingly, an object of the present invention is to provide an electrical connector having an improved position member for soldering to a substrate and positioning a heat sink assembled on the electrical connector.

According to one aspect of the present invention, an electrical connector for positioning a heat sink assembled on the electrical connector and for soldering to a substrate includes an insulating housing, a plurality of electrical contacts received in the insulating housing and a position member assembled to the insulating housing, the position member includes an interlock member and a soldering member assembled to the interlock member, the interlock member includes an assembling portion and an extending portion extending upwardly from the assembling portion for hooking with the heat sink, the soldering member includes a body portion and a pair of soldering portions extending downwardly from the body portion for soldering to the substrate.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
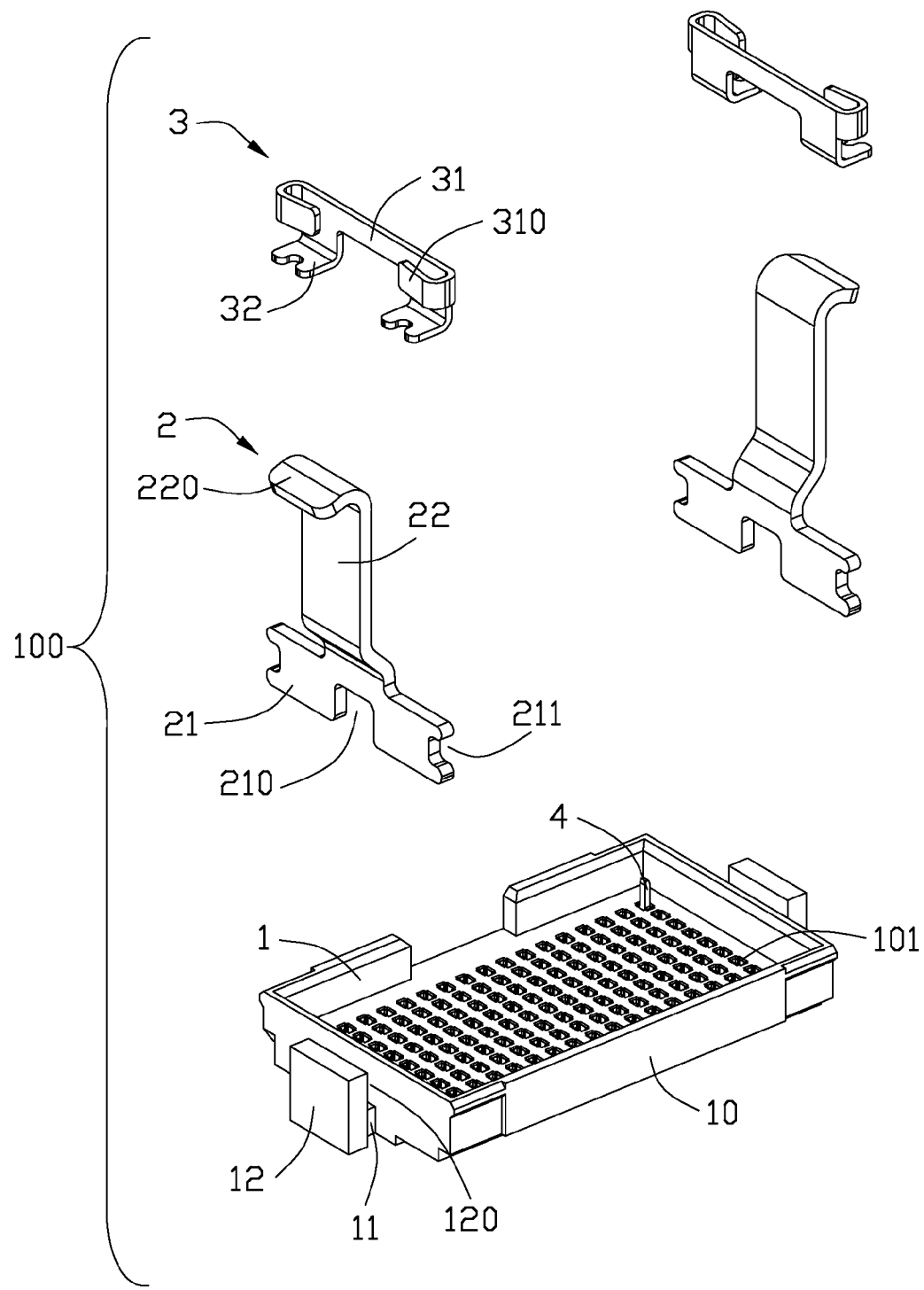
FIG. 1 is an exploded view of an electrical connector according to a preferred embodiment of the present invention.

FIG. 1 illustrates an electrical connector 100 in accordance to a preferred embodiment of the present invention. The electrical connector 100 comprises an insulating housing 1 with a plurality of electrical contacts 4 received therein and a position member (not labeled) assembled on the insulating housing 1. The position member includes an interlock member 2 and a soldering member 3 assembled to the interlock member 2. The interlock member 2 is used to hook with a heat sink (not shown) assembled on the electrical connector 100. The soldering member 3 is soldered to a substrate (not shown) to position the insulating housing 1 on the substrate.

The insulating housing 1 comprises a main portion 10, a support member 11 extending from the main portion 10 and a block 12 extending from the support member 11. The main portion 10 includes a plurality of passageways for receiving the electrical contacts 4. There is a space 120 between the main portion 10 and the block 12 for receiving the position member.

The interlock member 2 is made of stainless steel and includes an assembling portion 21 and an extending portion 22 extending upwardly from the assembling portion 21. Each of the two opposite ends of the assembling portion 21 includes a first recess 211. The extending portion 22 includes a hook 220 at the end thereof for interlocking with the heat sink assembled on the electrical connector 100. The assembling portion 21 includes a second recess 210 recessed from the bottom end thereof.

The soldering member 3 is made of copper material and includes a body portion 31, a pair of holding portions 310 extending from two opposite ends of the body portion 31 and a pair of soldering portions 32 extending downwardly from the body portion 31. The soldering portion 31 is plated with tin for being soldered to the substrate.

Figure 2:
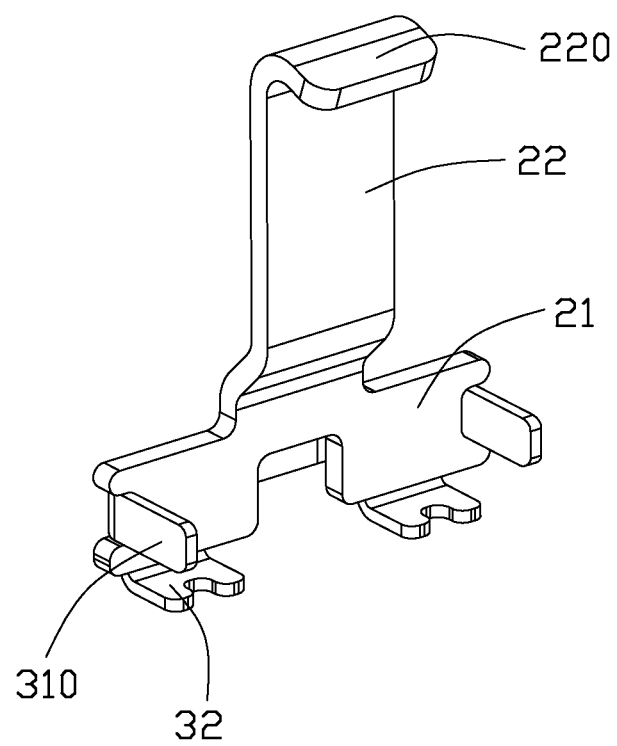
FIG. 2 is an assembled view of the position member as shown in FIG. 1, wherein the soldering member is not positioned on the interlock member.
Figure 3:
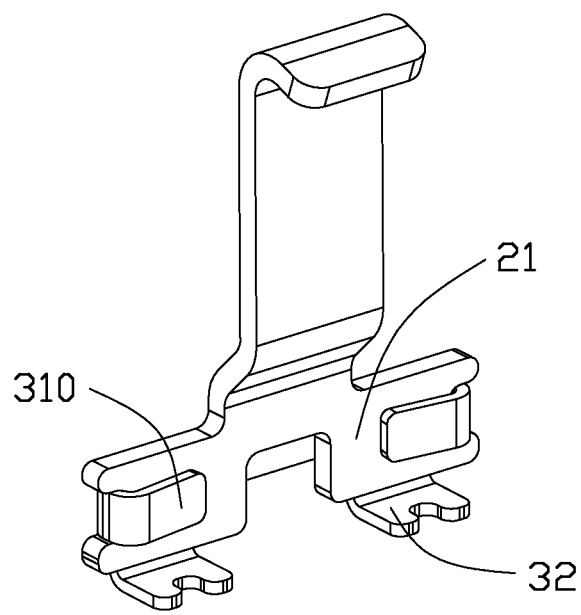
FIG. 3 is similar to FIG. 2, where in the soldering member is positioned on the interlock member.

Referring to FIGS. 2-3, when assemble the soldering member 3 to the interlock member 2, the pair of holding portions 310 receive in the pair of first recesses 211 to make the body portion 31 of the soldering member 3 overlap with the assembling portion 21 of the interlock member 2, and then bend the pair of holding portions 310 to make the interlock member 2 position on the soldering member 3 securely. At the same time, the soldering portions 32 locate under the assembling portion 21 of the interlock member 2.

Figure 4:
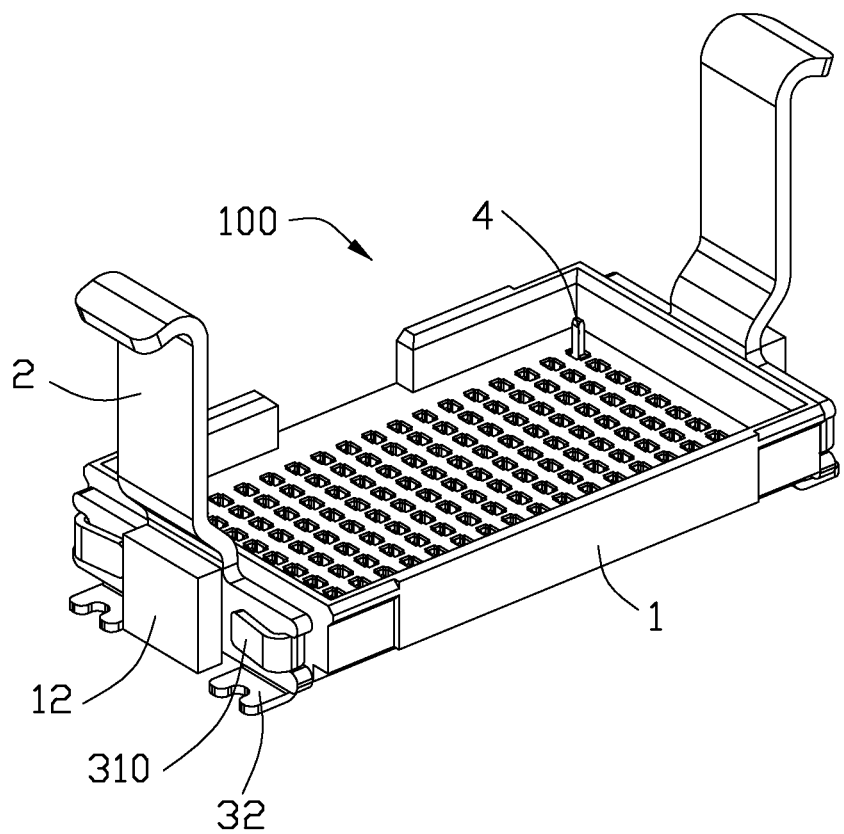
FIG. 4 is an assembled view of the electrical connector as shown in FIG. 1.

Referring to FIG. 4, when assemble the position member to the insulating housing 1, assemble the position member to the space 120 of the insulating housing 1, the support member 11 receives in the second recess 210 of the interlock member 2 and the block 12 limit the position member on the insulating housing 1.

The position member in this invention includes an interlock member 2 for hooks with a heat sink and a soldering member 3 assembled to the interlock member 2 for soldering to a substrate. To satisfy the need of soldering, the soldering member 3 is plated with tin and selected material of copper. Due to the soldering member 3 is separated from the interlock member 2, thus can only plate tin on the soldering member 3. The interlock member 2 is made of stainless steel which can prevent from producing metal filing when hooks with the heatsink. In brief, even though the technology of converting one piece into two pieces may be known, compared with the inventor's previous design shown in the copending application Ser. No. 14/052,607 filed Oct. 11, 2013 which discloses the singular latch structure relative to the housing in a floating manner, the invention has the discrete interlock members each assembled to the housing with the soldering member attached thereon can obtain the specific advantage which was not recognized before.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for positioning a heat sink assembled on the electrical connector and for soldering to a substrate, comprising:
   an insulating housing;
   a plurality of electrical contacts received in the insulating housing; and
   a position member assembled to the insulating housing; wherein
   the position member includes an interlock member and a soldering member assembled to the interlock member, the interlock member includes an assembling portion and an extending portion extending upwardly from the assembling portion for hooking with the heat sink, the soldering member includes a body portion and a pair of soldering portions extending downwardly from the body portion for soldering to the substrate; wherein
   the insulating housing comprises a main portion, a support member extending from the main portion and a block extending from the support member, and there is a space between the main portion and the block for receiving the position member.

2. The electrical connector as claimed in claim 1, wherein the soldering member is made of copper material and plated with tin material.

3. The electrical connector as claimed in claim 2, wherein the interlock member is made of stainless steel.

4. The electrical connector as claimed in claim 1, wherein each of the two opposite ends of the assembling portion includes a first recess, the soldering member includes a pair of holding portions extending from two opposite ends of the body portion and receives in the first recesses to hold the soldering member on the interlock member.

5. The electrical connector as claimed in claim 1, wherein the assembling portion includes a second recess recessed from the bottom end thereof for receiving the support member.

6. An electrical connector for positioning a heat sink assembled on the electrical connector and for soldering to a substrate, comprising:
   an insulating housing;
   a plurality of electrical contacts received in the insulating housing; and
   a position member assembled to the insulating housing; wherein
   the position member includes an interlock member for hooking with the heat sink and a soldering member assembled to the interlock member for soldering to the substrate, the soldering member is made of copper material and plated with tin material, the interlock member is made of stainless steel; wherein
   the insulating housing comprises a main portion, a support member extending from the main portion and a block extending from the support member, and there is a space between the main portion and the block for receiving the position member.

7. The electrical connector as claimed in claim 6, wherein the interlock member includes a pair of first recess, the soldering member includes a pair of holding portions receives in the first recesses to hold the soldering member on the interlock member.

8. The electrical connector as claimed in claim 6, wherein the interlock member includes a second recess recessed from the bottom end thereof for receiving the support member.

9. An electrical connector comprising:
   an insulative housing defining an upward mating port facing to an exterior in a vertical direction;
   a plurality of contacts disposed in the housing with contacting sections exposed in the mating port;
   a pair of position members secured respectively to two opposite ends of the housing in a longitudinal direction perpendicular to said vertical direction, each of said position members including an interlocking member and a soldering member assembled to each other, the interlocking member including a lower assembling portion secured to the housing and an upper hook for locking a heat sink, and the soldering member including at least one soldering portion for surface mounting to a printed circuit board; wherein
   said interlocking member and said soldering member are discrete from each other with different materials; wherein
   both said interlocking member and said soldering member are made from a sheet structure, and the housing defines a slot with a width similar to a sum of thicknesses of both said interlocking member and said soldering member.

10. The electrical connector as claimed in claim 9, wherein said slot is formed between a block and a longitudinal end wall of the housing.

11. The electrical connector as claimed in claim 9, wherein both said interlocking member and said soldering member are made from a sheet structure, and the interlocking member is thicker than the soldering member.

12. The electrical connector as claimed in claim 9, wherein each of the soldering members further includes another soldering portions spaced from the soldering portion in a transverse direction perpendicular to both said vertical direction and said longitudinal direction.

13. The electrical connector as claimed in claim 12, wherein each of said soldering members includes a pair of holding portions spaced from each other in the transverse direction to secure to the corresponding interlocking member.

14. The electrical connector as claimed in claim 9, wherein the interlocking member defines a downward notch to receive a corresponding support member of the housing.

15. The electrical connector as claimed in claim 9, wherein said interlocking member is made of stainless steel while the soldering member is made of copper with coating thereon.

* * * * *